(12) United States Patent
Kokubun et al.

(10) Patent No.: US 8,724,075 B2
(45) Date of Patent: May 13, 2014

(54) OPTICAL ELEMENT, EXPOSURE APPARATUS BASED ON THE USE OF THE SAME, EXPOSURE METHOD, AND METHOD FOR PRODUCING MICRODEVICE

(75) Inventors: Takao Kokubun, Fuchu (JP); Ryuichi Hoshika, Sagamihara (JP)

(73) Assignee: Nikon Corporation, Tokyo (JP)

( * ) Notice: Subject to any disclaimer, the term of this patent is extended or adjusted under 35 U.S.C. 154(b) by 609 days.

(21) Appl. No.: 12/923,282

(22) Filed: Sep. 13, 2010

(65) Prior Publication Data

US 2011/0013160 A1    Jan. 20, 2011

Related U.S. Application Data

(63) Continuation of application No. 11/512,087, filed on Aug. 30, 2006, now Pat. No. 7,812,926.

(60) Provisional application No. 60/772,878, filed on Feb. 14, 2006.

(30) Foreign Application Priority Data

Aug. 31, 2005 (JP) ................................. 2005-250556
Feb. 3, 2006 (JP) ................................. 2006-026516

(51) Int. Cl.
    *G03B 27/52*    (2006.01)
(52) U.S. Cl.
    USPC ................................. 355/30; 355/53; 355/67
(58) Field of Classification Search
    USPC ................................. 355/30, 53, 67
    See application file for complete search history.

(56) References Cited

U.S. PATENT DOCUMENTS

| | | | |
|---|---|---|---|
| 4,346,164 | A | 8/1982 | Tabarelli et al. |
| 4,480,910 | A | 11/1984 | Takanashi et al. |
| 5,610,683 | A | 3/1997 | Takahashi |
| 5,715,039 | A | 2/1998 | Fukuda et al. |
| 5,825,043 | A | 10/1998 | Suwa |
| 7,148,148 | B2 | 12/2006 | Mori et al. |
| 7,413,831 | B2 | 8/2008 | Sugawara |
| 7,433,019 | B2 | 10/2008 | Kiuchi et al. |

(Continued)

FOREIGN PATENT DOCUMENTS

| | | | |
|---|---|---|---|
| DE | 221 563 | A1 | 4/1985 |
| DE | 224 448 | A1 | 7/1985 |

(Continued)

OTHER PUBLICATIONS

Aug. 16, 2011 Office Action in Japanese Patent Application No. 2006-232979 (with English translation).

(Continued)

*Primary Examiner* — Steven H Whitesell Gordon
*Assistant Examiner* — Mesfin T Asfaw
(74) *Attorney, Agent, or Firm* — Oliff PLC (57) ABSTRACT

An optical element includes a base material, a liquid-repellent member provided on at least a part of a surface of the base material, and a light-reducing member provided between the base material and the liquid-repellent member to protect the liquid-repellent member from radiation of light by reducing the light. The optical element is usable for a liquid immersion exposure apparatus for exposing a substrate through a liquid. It is possible to avoid any inflow of the liquid in a liquid immersion area into an unexpected place via the optical element.

42 Claims, 5 Drawing Sheets

(56) References Cited

U.S. PATENT DOCUMENTS

| | | | |
|---|---|---|---|
| 7,697,111 B2 | 4/2010 | Shirai et al. | |
| 7,842,436 B2 | 11/2010 | Misaka | |
| 2004/0165159 A1 | 8/2004 | Lof et al. | |
| 2005/0069788 A1 | 3/2005 | Tanaka et al. | |
| 2005/0225737 A1* | 10/2005 | Weissenrieder et al. | 355/53 |
| 2005/0237504 A1 | 10/2005 | Nagasaka et al. | |
| 2006/0121209 A1* | 6/2006 | Matheus Baselmans et al. | 427/532 |
| 2006/0164616 A1 | 7/2006 | Okada | |
| 2006/0176456 A1 | 8/2006 | Nagasaka et al. | |
| 2006/0291060 A1 | 12/2006 | Shirai et al. | |
| 2007/0216889 A1 | 9/2007 | Nishii | |
| 2007/0242242 A1 | 10/2007 | Nagasaka et al. | |

FOREIGN PATENT DOCUMENTS

| | | |
|---|---|---|
| EP | 1 571 698 A1 | 9/2005 |
| EP | 1 646 074 A1 | 4/2006 |
| EP | 1 670 038 A1 | 6/2006 |
| EP | 1 843 385 A1 | 10/2007 |
| JP | A 58-202448 | 11/1983 |
| JP | A 59-019912 | 2/1984 |
| JP | A 62-065326 | 3/1987 |
| JP | A 63-157419 | 6/1988 |
| JP | A 04-305915 | 10/1992 |
| JP | A 04-305917 | 10/1992 |
| JP | A 05-062877 | 3/1993 |
| JP | A 06-124873 | 5/1994 |
| JP | A 07-220990 | 8/1995 |
| JP | A 08-316125 | 11/1996 |
| JP | A 10-303114 | 11/1998 |
| JP | A 10-340846 | 12/1998 |
| JP | A 11-149812 | 6/1999 |
| JP | A 11-176727 | 7/1999 |
| JP | A 2000/058436 | 2/2000 |
| JP | A 2003-161806 | 6/2003 |
| TW | 200301507 A | 7/2003 |
| TW | 200307312 A | 12/2003 |
| TW | 200513809 A | 4/2005 |
| TW | 200515481 A | 5/2005 |
| TW | 200516343 A | 5/2005 |
| WO | WO 99/49504 | 9/1999 |
| WO | WO 2004/019128 | 3/2004 |
| WO | WO 2004/053956 A1 | 6/2004 |
| WO | WO 2005/006417 A1 | 1/2005 |
| WO | WO 2005/020298 A1 | 3/2005 |
| WO | WO 2005/122220 A1 | 12/2005 |
| WO | WO 2006/080212 A1 | 8/2006 |

OTHER PUBLICATIONS

"Static solvent contact angle measurements, surface free energy and wettability determination of various self-assembled monolayers on silicon dioxide", by Dimitri Janssen et al., Thin Sold Films 515 (2006) pp. 1433-1438.

"Frontline water-repellent technology. High functionality and its expanding technology; from super-water repellent technology to application closer to our life", edited by Toray Research Center, Inc., Research Division, published on Jun. 15, 2007, p. 1, lines 1-12.

Mar. 28, 2013 Office Acton issued in Korean Patent Application No. 10-2006-0083710 (with English Translation).

Mar. 21, 2013 Office Action issued in Taiwanese Patent Application No. 095131890 (with English Translation).

Jul. 8, 2013 Office Action issued in European Patent Application No. 06 018 232.6.

Dec. 24, 2008 Office Action issued in U.S. Appl. No. 11/512,087.

Aug. 4, 2009 Office Action issued in U.S. Appl. No. 11/512,087.

* cited by examiner

OPTICAL ELEMENT, EXPOSURE APPARATUS BASED ON THE USE OF THE SAME, EXPOSURE METHOD, AND METHOD FOR PRODUCING MICRODEVICE

This is a Continuation of application Ser. No. 11/512,087 filed Aug. 30, 2006, which claims the benefit of U.S. Provisional Application No. 60/772,878 filed Feb. 14, 2006, and also claims the priority of Japanese Patent Application No. 2005-250556 filed Aug. 31, 2005 and Application No. 2006-026516 filed Feb. 3, 2006. The disclosures of the prior applications are hereby incorporated by reference herein in their entirety.

BACKGROUND OF THE INVENTION

1. Field of the Invention

The present invention relates to an exposure apparatus in which a liquid immersion area is formed in an optical path space disposed on a side of a substrate, an optical element which is usable for the exposure apparatus, an optical system which includes the optical element, an exposure method which is based on the use of the exposure apparatus, and a method for producing a microdevice based on the use of the exposure apparatus.

2. Description of the Related Art

Those having been hitherto suggested as the exposure apparatus of this type include, for example, an exposure apparatus described in International Publication No. 99/49504. The exposure apparatus of this patent document is provided with an illumination optical system which irradiates a mask such as a photomask or a reticle with an exposure light beam radiated from an exposure light source, and a projection optical system which projects an exposure pattern formed on the mask onto a substrate such as a glass plate or a wafer coated with a photosensitive material (resist). The illumination optical system and the projection optical system have barrels respectively. At least one optical element (for example, a lens) is accommodated in each of the barrels.

In the case of the exposure apparatus described in International Publication No. 99/49504, a liquid (pure water), which has a refractive index higher than that of the gas, is supplied to the optical path space as the space formed between the projection optical system and the substrate to form a liquid immersion area in order to respond to the advance of the high density of the device and the advance of the fine pattern to be formed on the substrate. Therefore, the exposure light beam, which is allowed to pass through the projection optical system, is radiated onto the substrate after passing through the liquid immersion area.

In the case of the exposure apparatus described in International Publication No. 99/49504, the surface of the optical element arranged on the side nearest to the substrate in the projection optical system, which is opposed to the substrate, makes contact with the liquid. Therefore, for example, if a large amount of the liquid is unexpectedly supplied, for example, by a liquid supply control mechanism, the following possibility arises. That is, a part of the liquid disposed in the liquid immersion area may travel along the side surface of the optical element to make inflow into the barrel after passing through the gap between the optical element and a holder (holding member) for holding the optical element on the barrel. It is demanded that the optical element, which is used under the severe condition of the liquid immersion exposure, maintains appropriate characteristics for a long period of time.

SUMMARY OF THE INVENTION

An object of the present invention is to provide a novel optical element which is usable for a liquid immersion exposure apparatus and the liquid immersion exposure apparatus which is provided with the same, as well as an exposure method and a method for producing a microdevice based on the use of the liquid immersion exposure apparatus.

According to a first aspect of the present invention, there is provided an exposure apparatus which radiates an exposure beam onto a substrate; including an optical element which is irradiated with the exposure beam and of which an optical path space on an outgoing surface side of the optical element for the exposure beam is filled with a liquid; wherein the optical element includes a liquid-repellent functional film provided on at least a part of a surface of the optical element, which is located outside an effective area of the optical element.

According to this exposure apparatus, the liquid-repellent functional film makes it possible to avoid the adhesion of the liquid to any portion disposed outside the effective area of the optical element.

According to a second aspect of the present invention, there is provided an exposure apparatus which exposes a pattern formed on a mask on a substrate; including a projection optical system which has a plurality of optical elements and which projects the pattern onto the substrate in a state that a liquid immersion area is formed in an optical path space on a side of a light-outgoing surface of an optical element arranged nearest to the substrate among the optical elements; and a light-shielding film and a liquid-repellent film provided on a part of a surface which is located outside an effective area of at least one optical element of the plurality of optical elements.

According to the exposure apparatus of the second aspect, it is possible to avoid the adhesion of the liquid to any portion disposed outside the effective area of the optical element. Further, the light-shielding film makes it possible to avoid the radiation of the light onto the liquid-repellent film.

According to a third aspect of the present invention, there is provided a method for producing a microdevice; including an exposure step for exposing a predetermined pattern on a substrate by using the exposure apparatus as defined in the first aspect; and a development step for developing the substrate exposed in the exposure step. According to this method for producing the microdevice, it is possible to produce the microdevice satisfactorily for a long period of time.

According to a fourth aspect of the present invention, there is provided a method for producing a microdevice; including an exposure step for exposing a predetermined pattern on a substrate by using the exposure apparatus as defined in the second aspect; and a development step for developing the substrate exposed in the exposure step. According to this method for producing the microdevice, it is possible to produce the microdevice satisfactorily for a long period of time.

According to a fifth aspect of the present invention, there is provided an optical element which is used for a liquid immersion exposure apparatus; including a base material; a liquid-repellent member which is provided to cover at least a part of the base material; and a light-reducing member which is provided between the base material and the liquid-repellent member. According to this optical element, it is possible to avoid any unintended adhesion of the liquid to a part of the surface of the optical element to be used for the liquid immersion exposure apparatus. Further, the radiation of light onto the liquid-repellent member can be reduced by providing the light-reducing member between the liquid-repellent member and the base material of the optical element.

According to a sixth aspect of the present invention, there is provided an optical system which is used for a liquid immersion exposure apparatus; including the optical element provided with a base material; a liquid-repellent member which is provided to cover at least a part of the base material; and a light-reducing member which is provided between the base material and the liquid-repellent member. When the optical system is used in the liquid immersion exposure apparatus, it is possible to avoid any unintended adhesion of the liquid to the optical element of the optical system to be used for the exposure apparatus.

According to a seventh aspect of the present invention, there is provided a liquid immersion exposure apparatus for exposing a substrate via a liquid; including an optical element provided with a base material; a liquid-repellent member which is provided to cover at least a part of the base material; and a light-reducing member which is provided between the base material and the liquid-repellent member. According to this exposure apparatus, it is possible to avoid any unintended adhesion of the liquid to the optical element even when the liquid is used during the exposure.

According to an eighth aspect of the present invention, there is provided a liquid immersion exposure method including providing a substrate; and exposing the substrate via the optical element as defined in the fifth aspect. According to this exposure method, it is possible to continue the satisfactory exposure for a long period of time.

According to a ninth aspect of the present invention, there is provided a method for producing a microdevice, including exposing the substrate by the exposure method as defined in the eighth aspect; developing the exposed substrate; and processing the developed substrate. According to the method for producing the microdevice, it is possible to continue the production of the satisfactory microdevice.

According to a tenth aspect of the present invention, there is provided a method for producing an optical element which is used for a liquid immersion exposure apparatus; the method including providing a liquid-repellent member to cover at least a part of a base material; and providing a light-reducing member which protects the liquid-repellent member between the base material and the liquid-repellent member. According to this production method, it is possible to produce the optical element as defined in the fifth aspect.

According to an eleventh aspect of the present invention, there is provided a method for producing a liquid immersion exposure apparatus; the method including providing the optical element produced by the production method as defined in the tenth aspect; a step for providing an illumination optical system; a step for providing a projection optical system including the optical element provided at a predetermined position in a barrel; a step for providing a stage for carrying a substrate thereon; a step for providing a liquid supply system which supplies a liquid to a space between the projection optical system and the substrate; and an adjusting step for adjusting arrangement of the illumination optical system, the projection optical system, and the stage so that a light beam, which is emitted from a light source, is transmitted via the illumination optical system and the projection optical system in this order to arrive at the substrate. According to this method, it is possible to produce the liquid immersion exposure apparatus as defined in the seventh aspect.

DETAILED DESCRIPTION OF THE PREFERRED EMBODIMENTS

Figure 1:
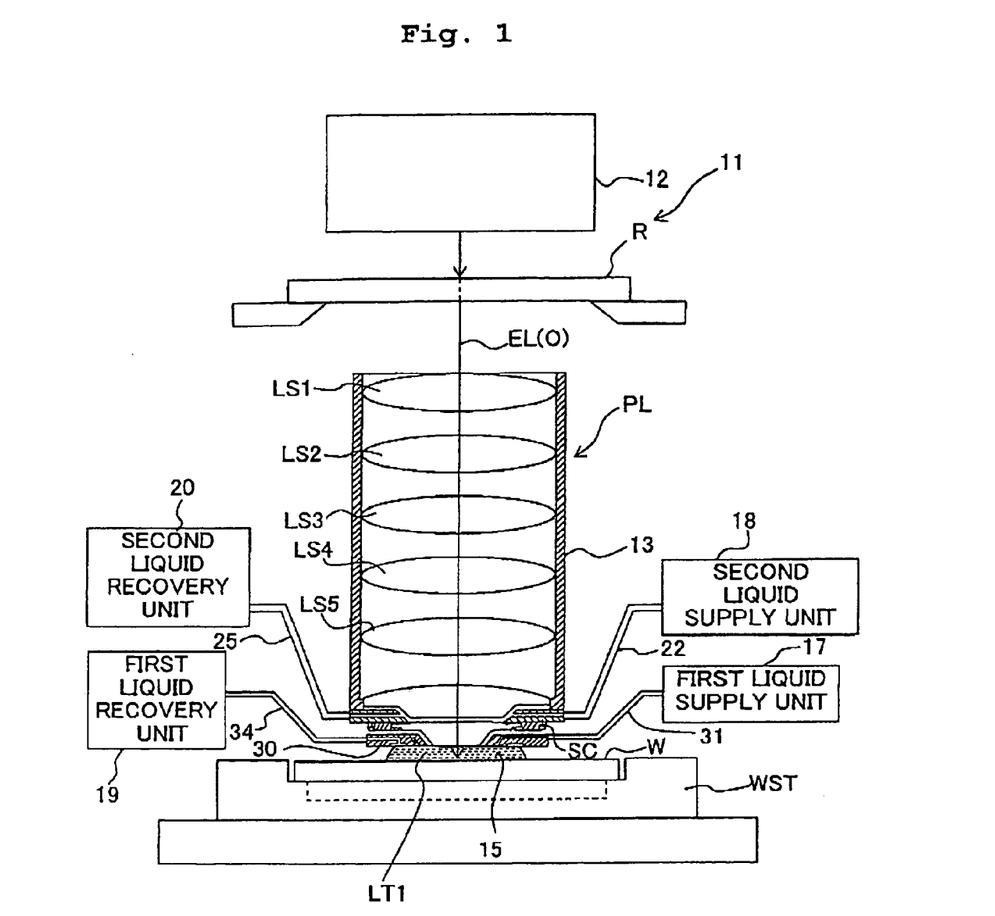
FIG. 1 shows a schematic arrangement illustrating an exposure apparatus according to an embodiment.

An exposure apparatus according to an embodiment of the present invention will be explained below with reference to the drawings. As shown in FIG. 1, the exposure apparatus 11 of the embodiment of the present invention transfers a circuit pattern formed on a reticle R to respective shot areas on a wafer W via a projection optical system PL while synchronously moving the reticle R as a mask and the wafer W as a substrate in one-dimensional direction (left and right directions in the plane of the paper of FIG. 1 in this embodiment). That is, the exposure apparatus 11 of this embodiment is a scanning type exposure apparatus based on the step-and-scan manner, i.e., a so-called scanning stepper. In this specification, the term "substrate" includes those obtained by coating a base material such as a semiconductor wafer with various types of films including, for example, a protective film (top coat film) and a photosensitive material (photoresist).

The exposure apparatus 11 is provided with, for example, an exposure light source (not shown), an illumination optical system 12, a reticle stage RST, the projection optical system PL, a wafer stage WST, and the like. The reticle stage RST retains the reticle R, and the wafer stage WST retains the wafer W. A light source, which emits the ArF excimer laser beam (wavelength: 193 nm) as the exposure light beam EL, is used for the exposure light source of this embodiment.

The illumination optical system 12 is constructed to include, for example, an optical integrator such as an unillustrated fly's eye lens and a rod lens, various lens systems such as a relay lens and a condenser lens, an aperture diaphragm, and the like. The exposure light beam EL, which is emitted or radiated from the unillustrated exposure light source, is adjusted so that the exposure light beam EL is allowed to pass through the illumination optical system 12 to thereby irradiate the pattern on the reticle R uniformly.

The reticle stage RST is arranged between the illumination optical system 12 and the projection optical system PL so that the surface, on which the reticle R is to be placed, is substantially perpendicular to the optical path. That is, the reticle stage RST is arranged on the side of the object plane of the projection optical system PL (light-incoming side for the exposure light beam EL, i.e., on the upper side as shown in FIG. 1).

The projection optical system PL includes a plurality of lens elements LS1, LS2, LS3, LS4, LS5, LS6, LS7 (only seven lens elements are shown in FIG. 1). Hereinafter, the lens element LS7 disposed on the side nearest to the wafer W among the respective lens elements LS1 to LS7 is referred to as "first specified lens element". The lens elements LS1 to LS6 except for the lens element LS7 are retained in a barrel 13. The spaces between the respective lens elements LS1 to LS6 disposed in the barrel 13 are filled with the purge gas (for example, nitrogen). A lens holder 14, which is provided to hold the first specified lens element (first specified optical element) LS7, is arranged at the lower end of the barrel 13. Each of the lens elements LS1 to LS7 has a light-incoming surface into which the exposure light beam EL is allowed to come, and a light-outgoing surface from which the incident exposure light beam EL is allowed to outgo. The respective lens elements LS1 to LS7 are arranged so that the optical axes (O) are substantially coincident with each other and the optical path space is formed on a side of the light-incoming surface and a side of the light-outgoing surface of each of them.

The wafer stage WST is arranged so that the placing surface for the wafer W is substantially perpendicular to the optical path for the exposure light beam EL on the image plane side of the projection optical system PL. The image of the pattern on the reticle R illuminated with the exposure light beam EL is projected and transferred onto the wafer W disposed on the wafer stage WST in a state of being reduced by a predetermined reduction magnification via the projection optical system PL.

In this arrangement, the exposure apparatus 11 of this embodiment is a liquid immersion exposure apparatus to which the liquid immersion method is applied in order that the wavelength of the exposure light beam EL is substantially shortened to improve the resolution and the depth of focus is substantially widened. Therefore, the exposure apparatus 11 is provided with a liquid immersion mechanism. The liquid immersion mechanism is provided with a liquid supply system including a first liquid supply unit 17 and a second liquid supply unit 18 for individually supplying the pure water LQ to an optical path space 15 disposed on the side of the light-outgoing surface of the first specified lens element LS7 and an optical path space 16 disposed on the side of the light-incoming surface. The liquid immersion mechanism is provided with a first liquid recovery unit 19 and a second liquid recovery unit 20 for individually recovering the pure water LQ supplied to the optical path space 15 and the optical path space 16.

Figure 2:
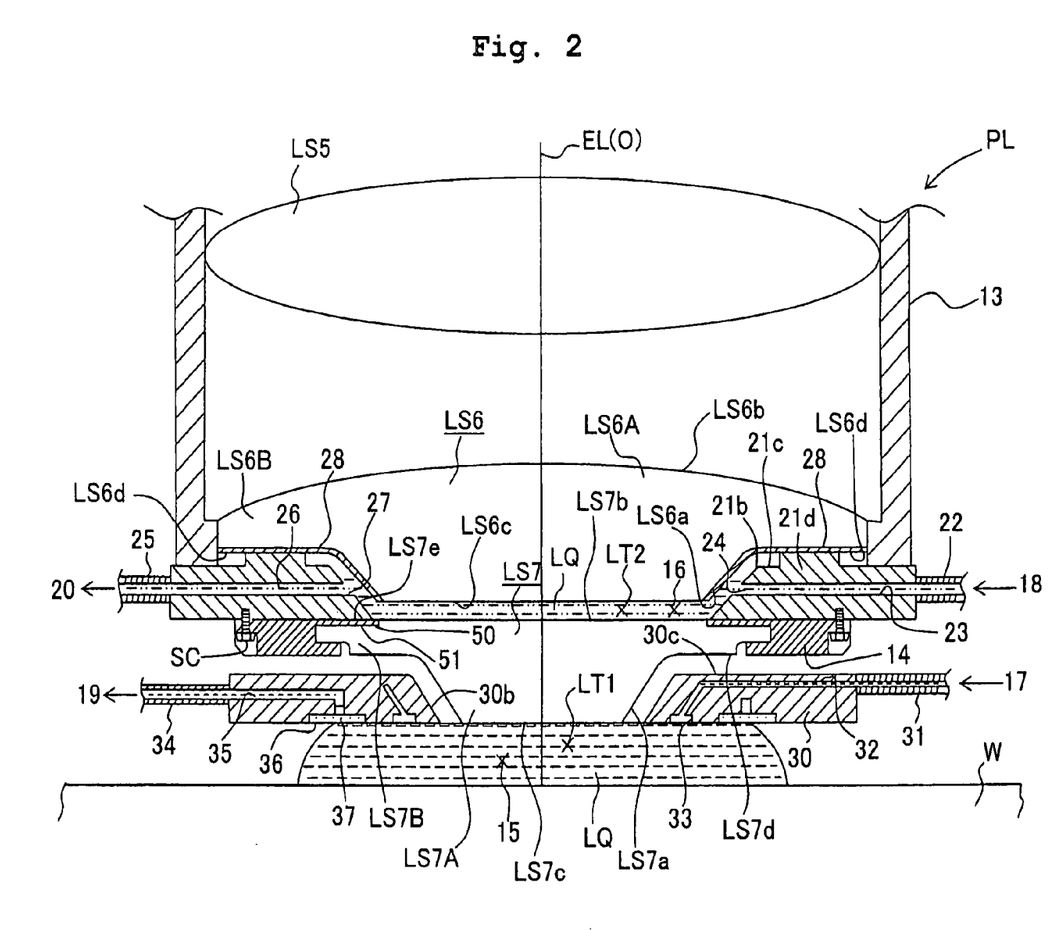
FIG. 2 shows a schematic arrangement illustrating magnified parts of the exposure apparatus according to the embodiment.

As shown in FIG. 2, a liquid immersion area LT1 is formed in the optical path space 15 between the first specified lens element LS7 and the wafer W by supplying the pure water LQ from the first liquid supply unit 17. The pure water LQ, which forms the liquid immersion area LT1, is recovered from the optical path space 15 on the basis of the driving of the first liquid recovery unit 19. A liquid immersion area LT2 is formed in the optical path space 16 between the first specified lens element LS7 and the lens element (second specified optical element) LS6 arranged on a side of the object plane of the projection optical system PL with respect to the first specified lens element LS7 by supplying the pure water LQ from the second liquid supply unit 18. That is, the lens element LS6 is constructed as the second specified lens element which is disposed most closely to the image plane of the projection optical system PL next to the first specified lens element LS7. The pure water LQ, which forms the liquid immersion area LT2, is recovered from the optical path space 16 on the basis of the driving of the second liquid recovery unit 20.

In this arrangement, the second specified lens element LS6 is an optical element having a refractive power (lens function). The second specified lens element LS6 has a lower surface LS6c which has a shape of flat surface, and an upper surface LS6b which is formed to be convex toward the object plane of the projection optical system PL to provide the positive refractive power. The second specified lens element LS6 has a substantially circular shape as viewed in an upper plan view. The outer diameter of the upper surface LS6b is formed to be larger than the outer diameter of the lower surface LS6c. That is, the second specified lens element LS6 has its central portion which is an exposure light beam passage portion (effective area) LS6A for allowing the exposure light beam EL to pass therethrough. Further, a flange portion LS6B is formed on a side of the outer circumference of the exposure light beam passage portion LS6A. The second specified lens element LS6 is supported by the barrel 13 by the aid of the flange portion LS6B. In this specification, the "effective area" of the optical element is the area in which the light other than any unnecessary light such as the flare light and the stray light is planned to be radiated onto the optical element or allowed to outgo therefrom, which is the area established upon the optical design. For example, when the concerning optical element is incorporated in an imaging optical system such as the projection optical system, the effective area is defined as follows. That is, the effective area of the optical plane is the area occupied on the optical plane by the light flux allowed to arrive at the optical plane of the optical element (subjected to the backward ray trace) when the light flux having the maximum numerical aperture is subjected to the backward ray trace from all image points in the image field as the area practically subjected to the aberration correction on the image plane of the imaging optical system. When the optical element is provided with a plurality of optical planes, the respective effective areas are the effective areas of the optical element (optical element includes a plurality of effective areas).

The first specified lens element LS7 is a plane-parallel plate having no refractive power through which the exposure light beam EL is transmissive. The lower surface LS7c and the upper surface LS7b are parallel to one another. The first specified lens element LS7 has a substantially circular shape as viewed in an upper plan view. The outer diameter of the upper surface LS7b is formed to be larger than the outer diameter of the lower surface LS7c. That is, the central portion of the first specified lens element LS7 is the exposure light beam passage portion (effective area) LS7A for allowing the exposure light beam EL to pass therethrough. Further, the flange portion LS7B is formed on a side of the outer circumference of the exposure light beam passage portion LS7A. The first specified lens element LS7 is supported by the lens holder 14 by the aid of the flange portion LS7B.

An annular nozzle member 21 (hereinafter referred to as "second nozzle member" because the nozzle member supplies the pure water LQ to the second optical path space 16 as counted from the side of the wafer W) is arranged to surround the optical path for the exposure light beam EL between the barrel 13 and the lens holder 14 in the projection optical system PL of the embodiment of the present invention. The second nozzle member 21 is fixed to the lower end of the barrel 13 by means of screws (not shown). The lens holder 14 is fixed to the lower surface side of the second nozzle member 21 by means of a plurality of screws SC (only two screws are shown in FIG. 2).

As shown in FIG. 2, the second nozzle member 21 is arranged such that the inner side surface 21b is opposed to the side surface LS6a disposed between the lower surface LS6c and the lower surface LS6d of the second specified lens element LS6, and the upper surface 21c is opposed to the lower surface LS6d of the second specified lens element LS6. An annular projection 21d is formed on the upper surface 21c of the second nozzle member 21. An extremely narrow gap is formed by the projection 21d between the upper surface of the projection 21d and the lower surface LS6d of the second specified lens element LS6. That is, the second nozzle member 21 is arranged to make no contact with the second specified lens element LS6 by forming the gap between the inner side surface 21b and the side surface LS6a of the second specified lens element LS6 and between the upper surface of the projection 21*d* of the second nozzle member 21 and the lower surface LS6*d* of the second specified lens element LS6.

Figure 3:
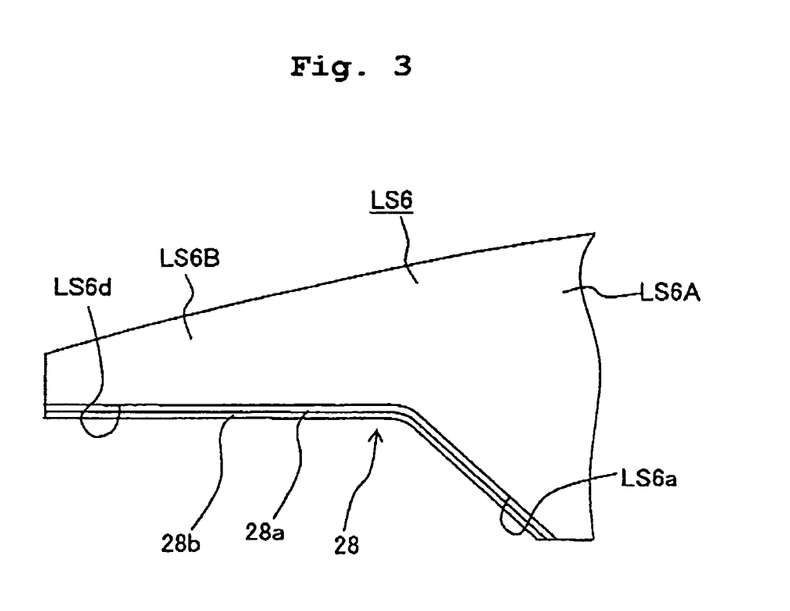
FIG. 3 shows an arrangement of a liquid-repellent functional film according to the embodiment.

A water-repellent functional film 28, which serves as a liquid-repellent functional film, is formed on the side surface LS6*a* of the second specified lens element LS6 and the lower surface LS6*d* of the flange portion LS6B, i.e., on the surface portion disposed outside the effective area of the second specified lens element LS6, i.e., in the area which does not intersect the optical axis (O) of the second specified lens element LS6. As shown in FIG. 3, the water-repellent functional film 28 is composed of a light-shielding film 28*a* which is formed on the surface of the lower surface LS6*d* and the side surface LS6*a* of the second specified lens element LS6, and a water-repellent film 28*b* which is the liquid-repellent film formed on the surface of the light-shielding film 28*a*. In this arrangement, the water-repellent film 28*b*, which constitutes the water-repellent functional film 28, is formed of a fluororesin material capable of effecting the film formation at a low temperature, a fluorine-based resin material such as polytetrafluoroethylene, an acrylic resin material, or a silicon-based resin material. CYTOP (manufactured by ASAHI GLASS CO., LTD.) may be used as the water-repellent film. The light-shielding film 28*a*, which constitutes the water-repellent functional film 28, is one of a metal film and a metal oxide film having an optical density OD of not less than 1. Specifically, the metal film may be a film formed of at least one metal selected from the group consisting of Au, Pt, Ag, Ni, Ta, W, Pd, Mo, Ti, Si, and Cr. Specifically, the metal oxide film may be a film formed of at least one substance selected from the group consisting of $ZrO_2$, $HfO_2$, $TiO_2$, $Ta_2O_5$, SiO, and $Cr_2O_3$. That is, it is allowable to use a single substance selected from the oxide group. Alternatively, it is allowable to use any mixture thereof as well.

Examples of the combination of the water-repellent film/light-shielding film (material and film thickness) include fluororesin: 1.0 μm/Si: 200 nm, fluororesin: 1.0 μm/Ta: 200 nm, fluororesin 0.5 μm/$Cr_2O_3$: 50 nm/Cr: 150 nm, fluororesin: 0.5 μm/W: 100 nm/Cr: 100 nm, and the like. In any one of these combinations, it is possible to provide OD of not less than 1.

An explanation will be made below about a method for providing the liquid-repellent functional film 28 on the second specified lens element LS6. At first, the light-shielding film 28*a* is formed outside the effective area on the surface of the optical element LS6. When one of the metal film and the metal oxide film is formed as the light-shielding film 28*a*, it is possible to use the dry film formation method including, for example, the vacuum vapor deposition method, the ion beam assisted vapor deposition method, the gas cluster ion beam assisted vapor deposition method, the ion plating method, the ion beam sputtering method, the magnetron sputtering method, the bias sputtering method, and the radio frequency sputtering method. It is preferable that the film thickness is adjusted by means of the film formation time and the film formation condition including, for example, film formation rate, and the optical density OD is made not less than 1 by means of the absorption and the reflection of the film obtained thereby. The light-shielding film 28*a* may typically have a thickness of 100 nm to 300 nm. Those usable to provide the film outside the effective area on the surface include, for example, the mask method in which the effective area of the optical element LS6 is previously masked with a seal or the like to form the film, and the method in which a shielding member is provided in the apparatus such as the vapor deposition apparatus to prevent any deposited matter in the effective area.

Subsequently, an explanation will be made about a method for forming the water-repellent film 28*b* on the light-shielding film. Those usable as the method for forming the film in the wet state include, for example, the spin coat method and the dip coat method. In this procedure, the film having the appropriate liquid-repellent function can be formed by adjusting, for example, the concentration of the resin solution and the number of revolutions and the pull-up speed when the coating is performed. The water-repellent film 28*b* may typically have a thickness of 0.1 to 2.0 μm. In the present invention, it is affirmed that the sufficient liquid-repellent function is provided on condition that the contact angle is not less than 90 degrees with respect to the liquid to be used, for example, for the liquid immersion exposure. The durability may be improved by improving the strength of the film by effecting the heating after the coating of the liquid-repellent film in accordance with the method as described above.

The water-repellent functional film 28 has the light-shielding film 28*a* which is formed on the surface of the second specified lens element LS6. Therefore, it is possible to avoid the radiation of the light onto the water-repellent film 28*b*, the light resulting from the laser beam or the like as the exposure light beam EL. The water-repellent film 28*b* is formed outside the effective area of the second specified lens element LS6. Therefore, the exposure light beam EL is not radiated thereon directly. However, any unintended reflected light beam or any stray light is radiated onto the water-repellent film 28*b* in some situations. The optical deterioration of the water-repellent film 28*b* can be avoided by the light-shielding film 28*a*. In particular, in order to prevent the stray light from coming into the water-repellent film 28*b* after passing through the second specified lens element LS6, it is necessary that the light-shielding film 28*a* is provided between the water-repellent film 28*b* and the light-outgoing surface of the second specified lens element LS6. When the metal film is used for the light-shielding film 28*a*, it is possible to suppress the energy absorption by the light-shielding film 28*a*, because the metal film is the reflective film. It is possible to avoid the deterioration of the optical characteristics of the second specified lens element LS6 which would be otherwise caused by the increase in the temperature of the light-shielding film 28*a*. When the metal oxide film is used for the light-shielding film 28*a*, it is possible to avoid the stray light which would be caused by the reflection from the light-shielding film 28*a*, because the metal oxide film is the absorptive film.

The second nozzle member 21 is connected to the second liquid supply unit 18 via a liquid supply tube 22. A liquid supply passage 23, which is communicated with the liquid supply tube 22, is formed in the second nozzle member 21. The pure water LQ, which is allowed to flow through the liquid supply tube 22 and the liquid supply passage 23, is allowed to flow into the optical path space 16 via a supply opening 24 which is formed on the side of the inner side surface 21*b* of the second nozzle member 21. The second nozzle member 21 is connected to the second liquid recovery unit 20 via a liquid recovery tube 25. A liquid recovery passage 26, which is communicated with the liquid recovery tube 25, is formed in the second nozzle member 21. The pure water LQ, which is supplied to the liquid immersion area LT2 in the optical path space 16, is recovered by the second liquid recovery unit 20 via a recovery opening 27 which is formed on the side opposed to the supply opening 24 on the side of the inner side surface 21*b* of the second nozzle member 21. The recovery opening 27 is formed on the side of the object plane (upper position as shown in FIG. 2) as compared with the liquid immersion area LT2.

An annular nozzle member 30 (hereinafter referred to as "first nozzle member" because it supplies the pure water LQ to the first optical path space 15 as counted from the side of the wafer W) is arranged to surround the optical path for the exposure light beam EL between the lens holder 14 and the wafer W. The first nozzle member 30 is supported by an unillustrated support member to make no abutment against the first specified lens element LS7 and the lens holder 14.

The first nozzle member 30 is arranged so that the inner side surface 30b is opposed to the side surface LS7a disposed between the lower surface LS7c and the lower surface LS7d of the first specified lens element LS7, and the upper surface 30c is opposed to the lower surface LS7d of the flange portion LS7B of the first specified lens element LS7. The first nozzle member 30 is arranged to make no contact with the first specified lens element LS7 by forming the gap between the inner side surface 30b and the side surface LS7a of the first specified lens element LS7.

In this embodiment, there are provided a stepped shape 50 which is a circumferential boundary shape provided along the circumferential edge portion LS7e of the upper surface of the first specified lens element LS7, i.e., the edge of the first specified lens element LS7 outside the effective area on the side of the light-incoming surface of the first specified lens element LS7, and a water-repellent film 51 which is composed of a fluororesin capable of being formed into the film at a low temperature and which is provided on the surface of the first specified lens element LS7 outside the circumferential stepped shape 50. A water-repellent film or a light-shielding film and a water-repellent film may be provided outside the effective area of the first specified lens element LS7 (for example, on the side surface LS7a).

The first nozzle member 30 is connected to the first liquid supply unit 17 via a liquid supply tube 31. A liquid supply passage 32, which is communicated with the liquid supply tube 31, is formed in the first nozzle member 30. Further, a supply opening 33, which is communicated with the liquid supply passage 32, is formed in an annular form on the lower surface side of the first nozzle member 30. The first nozzle member 30 is connected to the first liquid recovery unit 19 via a liquid recovery tube 34. A liquid recovery passage 35, which is communicated with the liquid recovery tube 34, is formed in the first nozzle member 30. Further, a recovery opening 36, which is communicated with the liquid recovery passage 35, is formed in an annular form on the lower surface side of the first nozzle member 30. The recovery opening 36 is formed to surround the supply opening 33 outside the supply opening 33. A porous member 37, which is formed with a large number of holes or pores, is provided for the recovery opening 36.

Next, an explanation will be made about the function to be obtained when the pure water LQ is supplied to the respective optical path spaces 15, 16 of the exposure apparatus 11 of the embodiment of the present invention. When the wafer W, which is placed on the wafer stage WST, is arranged on the optical path for the exposure light beam EL, the first liquid supply unit 17 and the second liquid supply unit 18 start the driving. Accordingly, the pure water LQ is supplied from the first liquid supply unit 17. The pure water LQ is allowed to flow through the liquid supply tube 31 and the liquid supply passage 32, and the pure water LQ is supplied via the supply opening 33 into the optical path space 15. Simultaneously, the pure water LQ is supplied from the second liquid supply unit 18. The pure water LQ is allowed to flow through the liquid supply tube 22 and the liquid supply passage 23, and the pure water LQ is supplied via the supply opening 24 into the optical path space 16.

When a predetermined amount of the pure water LQ is supplied into the optical path space 15, the driving of the first liquid supply unit 17 is stopped. As a result, the liquid immersion area LT1, which is composed of the pure water LQ, is formed in the optical path space 15. When a predetermined amount of the pure water LQ is supplied, the driving of the second liquid supply unit 18 is stopped. As a result, the liquid immersion area LT2, which is composed of the pure water LQ, is formed in the optical path space 16.

During this process, a part of the pure water LQ disposed in the optical path space 16 makes inflow into the gap between the second specified lens element LS6 and the second nozzle member 21. However, the water-repellent functional film 28 is formed on the surface of the second specified lens element LS6. Therefore, the inflow of the pure water LQ into the optical path space disposed thereover is avoided owing to the water-repelling effect of the water-repellent functional film 28. If the pure water LQ makes inflow into the optical path space disposed thereover due to the absence of the formation of the water-repellent functional film 28 on the surface of the second specified lens element LS6, it is feared that the pure water LQ may be permeated into the optical thin film formed on the upper surface LS6b formed to have the convex shape toward the object plane of the second specified lens element LS6, and the optical characteristics of the optical thin film may be deteriorated. Further, the optical thin film may be dissolved by the pure water LQ, and it is impossible to maintain the desired optical performance. Accordingly, the water-repellent functional film 28 is required in order to avoid the inflow of the pure water LQ into the optical path space disposed over the second specified lens element LS6.

When the exposure apparatus according to the embodiment described above is used, a microdevice (for example, semiconductor element, image pickup element, liquid crystal display element, and thin film magnetic head) can be produced such that the mask (reticle) R is illuminated by using the illumination optical unit (illumination step), and the transfer pattern formed on the mask R is transferred to the substrate (wafer) W by using the projection optical system PL (transfer step). An explanation will be made below with reference to a flow chart shown in FIG. 4 about an example of the technique adopted when a semiconductor device is obtained as the microdevice by forming a predetermined circuit pattern, for example, on a wafer W as the substrate by using the exposure apparatus according to the embodiment described above.

Figure 4:
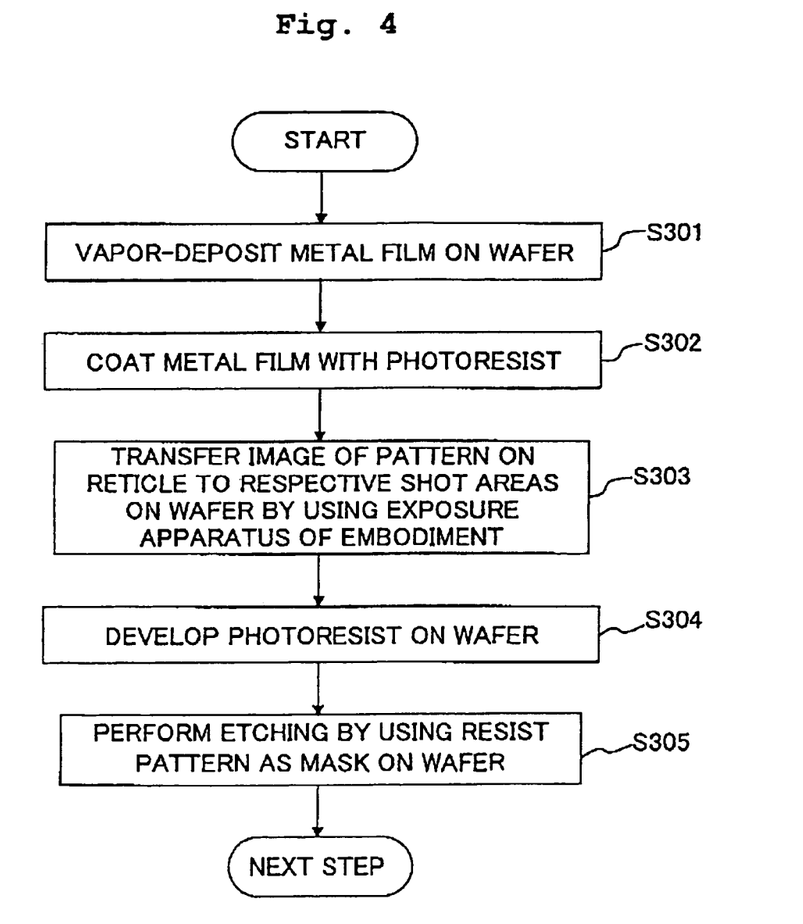
FIG. 4 shows a flow chart illustrating a method for producing a microdevice according to an embodiment.

At first, in Step S301 shown in FIG. 4, the metal film is vapor-deposited on 1 lot of wafer W. Subsequently, in Step S302, the metal film on 1 lot of wafer W is coated with the photoresist. After that, in Step S303, the image of the pattern on the mask R is successively transferred by the exposure to the respective shot areas on 1 lot of the wafer W via the projection optical system PL by using the exposure apparatus according to the embodiment described above. After that, in Step S304, the photoresist on 1 lot of the wafer W is developed. Subsequently, in Step S305, the etching is performed by using the mask of the resist pattern on 1 lot of the wafer W. Accordingly, the circuit pattern corresponding to the pattern on the mask R is formed on the respective shot areas on the respective wafers W.

After that, for example, the circuit pattern of the upper layer is formed, and thus the microdevice such as the semiconductor element is produced. According to the method for producing the semiconductor device as described above, the wafer can be satisfactorily exposed with the fine pattern, because the exposure apparatus according to the embodiment described above is used. In Step S301 to Step S305, the metal is vapor-deposited on the wafer W, and the metal film is coated with the resist to perform the respective steps of the exposure, the development, and the etching. However, it goes without saying that the oxide film of silicon may be formed on the wafer W prior to these steps, and then the oxide film of silicon may be coated with the resist to perform the respective steps of the exposure, the development, and the etching.

Figure 5:
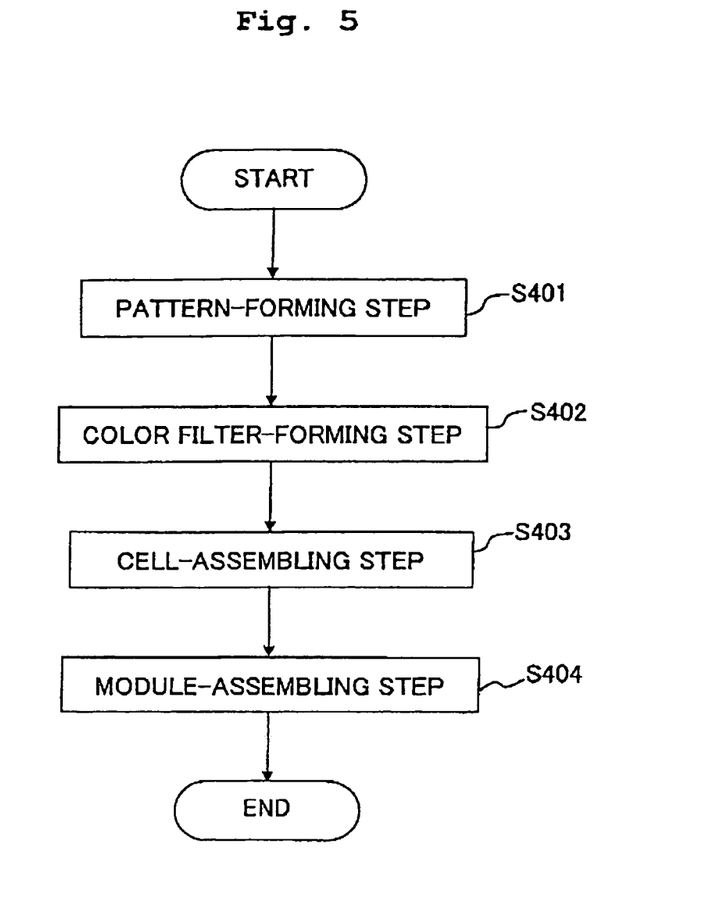
FIG. 5 shows a flow chart illustrating a method for producing a microdevice according to an embodiment.

In the case of the exposure apparatus according to the embodiment described above, a liquid crystal display element as the microdevice can be also obtained by forming a predetermined pattern (for example, a circuit pattern and an electrode pattern) on a plate (glass substrate). An explanation will be made below about an example of the technique adopted for this procedure with reference to a flow chart shown in FIG. 5. With reference to FIG. 5, in a pattern-forming step S401, the so-called photolithography step is executed, in which the pattern on the mask R is transferred to the substrate (for example, a glass substrate coated with the resist) to perform the exposure by using the exposure apparatus according to the embodiment described above. The predetermined pattern including, for example, a large number of electrodes is formed on the substrate by means of the photolithography step. After that, the exposed substrate is subjected to the respective steps including, for example, the development step, the etching step, and the resist exfoliation step. Accordingly, the predetermined pattern is formed on the substrate. The process proceeds to the next color filter-forming step S402.

Subsequently, in the color filter-forming step S402, a color filter is formed, in which a large number of sets of three types of dots corresponding to R (Red), G (Green), B (Blue) are arranged in a matrix form, or a plurality of sets of filters of three types of stripes of R, G, B are arranged in the horizontal scanning line direction. A cell-assembling step S403 is executed after the color filter-forming step S402. In the cell-assembling step 403, the liquid crystal panel (liquid crystal cell) is assembled by using, for example, the substrate having the predetermined pattern obtained in the pattern-forming step S401 and the color filter obtained in the color filter-forming step S402. In the cell-assembling step S403, for example, the liquid crystal is injected into the space between the substrate having the predetermined pattern obtained in the pattern-forming step S401 and the color filter obtained in the color filter-forming step S402 to produce the liquid crystal panel (liquid crystal cell).

After that, in a module-assembling step S404, respective parts including, for example, a backlight and an electric circuit for performing the display operation of the assembled liquid crystal panel (liquid crystal cell) are attached to complete the liquid crystal display element. According to the method for producing the liquid crystal display element as described above, the wafer can be satisfactorily exposed with the fine pattern, because the exposure apparatus according to the embodiment described above is used.

In the embodiment described above, the first specified lens element LS7 and the second specified lens element LS6 may be formed integrally, the liquid immersion area may be formed in only the space disposed on the light-outgoing surface side of the optical element which is integrally formed, and the water-repellent functional film may be provided on at least a part of the surface disposed outside the effective area of the optical element which is integrally formed.

In the embodiment described above, the explanation has been made as exemplified by the structure in which only the light-shielding film and the liquid-repellent film (water-repellent film) are provided on the base material (lens element) of the optical element. However, there is no limitation thereto. The optical element of the present invention may be provided with another film disposed between the light-shielding film and the liquid-repellent film and/or between the base material and the light-shielding film, for example, another functional film including, for example, a protective layer, a layer to improve the tight contact performance between the light-shielding film and the liquid-repellent film, and a layer to reinforce the mechanical strength. The liquid-repellent film is present at an uppermost layer of the liquid-repellent functional layer in view of the function thereof.

In the embodiment described above, the light-shielding film and the liquid-repellent film are formed on the base material (lens element) of the optical element. However, there is no limitation to the form of the film. It is possible to provide a light-shielding member and a liquid-repellent member having various forms. For example, it is also allowable to provide a frame-shaped formed member to cover the outer portion of the lens element (outside the effective area). Such a formed member may be composed of an integrated unit formed with the light-shielding substance and the liquid-repellent substance as described above. Alternatively, a member made of the light-shielding substance and a member made of the liquid-repellent substance may be overlapped and used. There is no limitation to the light-shielding member. It is possible to use any light-reducing member for reducing or dimming the incident light allowed to come into the liquid-repellent member.

In the embodiment described above, the light-shielding film and the liquid-repellent film are formed outside the effective area of the lens element. However, it is unnecessary to form the light-shielding film and the liquid-repellent film in all of the area except for the effective area. The light-shielding film and the liquid-repellent film may be formed in a part of the area. For example, the light-shielding film and the liquid-repellent film may be formed in only an annular area disposed closely to the outermost circumference of the lens element in radial outside area of the effective area of the lens element.

The embodiment described above is illustrative of the case in which the inclination (side surface LS6a) is provided at the outer circumferential portion of the light-outgoing surface of the lens element. However, the light-outgoing surface may be a flat surface, and the light-shielding film and the liquid-repellent film may be formed in an outer circumferential area of the flat surface (area which is not used as the effective area).

The light-shielding film and the liquid-repellent film may be provided on the side surface other than the light-outgoing surface of the lens element. In the embodiment described above, the light-shielding film and the liquid-repellent film are formed on the side surface provided for the light-outgoing surface. However, the light-shielding film and the liquid-repellent film may be formed on the side surface between the upper surface (light-incoming surface) and the lower surface (light-outgoing surface) of the lens element. In the case of the lens element having a hemispherical shape (constructed by a flat surface and a curved surface), the light-shielding film and the liquid-repellent film may be provided on the outer circumferential portion of the curved surface.

In the embodiment described above, the light-shielding film and the liquid-repellent film are applied to the second lens element of the projection optical system PL as the optical element. However, there is no limitation thereto. It is also possible to make the application to another lens element of the projection optical system having a certain possibility to make contact with the liquid. The optical element, which is provided with the light-shielding film and the liquid-repellent film according to the present invention, is not limited to the lens element of the projection optical system PL. The present invention is applicable to any optical element including, for example, lenses and light-transmissive plates provided for the alignment optical system and various sensors provided for the substrate stage (or the measuring stage as described later on). For example, as disclosed in International Publication No. 2006/64900, the present invention is also applicable to an exposure apparatus in which a photosensitive substrate is exposed with a pattern by using a plurality of diffraction gratings. In particular, the light-shielding film and the liquid-repellent film as explained in the embodiment described above may be provided on at least one of light-transmissive flat plates P1, P2 formed with diffraction gratings as shown in FIGS. 18 and 19 of International Publication No. 2006/64900.

In the embodiment described above, it is also allowable to use, for example, the KrF excimer laser (248 nm), the $Kr_2$ laser (146 nm), and the $Ar_2$ laser (126 nm) in addition to the $F_2$ laser (157 nm) as the exposure light source.

In the embodiment described above, the liquid may be those other than the pure water LQ. For example, when the exposure light source is the $F_2$ laser, it is desirable to use a fluorine-based liquid such as fluorine-based oil and perfluoropolyether (PFPE), because the $F_2$ laser beam is not transmissive through the pure water LQ. In this case, it is required to provide a functional film which is repellent against the fluorine-based liquid. It is necessary to provide a liquid-repellent functional film composed of a substance having a high contact angle with respect to the liquid to be used. One or a plurality of optical elements included in the optical elements for constructing the illumination optical system 12 or the projection optical system PL may be constructed to have the liquid-repellent functional film having the light-shielding film and the liquid-repellent film on the surface outside the effective area of the exposure light beam EL.

The embodiment described above has been explained as exemplified by the exposure apparatus having the single substrate stage by way of example. However, the optical system and the optical element of the present invention may be applied to a multi-stage (twin-stage) type exposure apparatus in which two substrate stages are moved between an exposure station and a measuring station. Such a multi-stage type exposure apparatus is disclosed in U.S. Pat. Nos. 6,341,007, 6,400,441, 6,549,269, 6,590,634, and 5,969,441. These United States patent documents are incorporated herein by reference.

Further, for example, as disclosed in International Publication No. 1999/23692 and U.S. Pat. No. 6,897,963, the present invention is also applicable to an exposure apparatus provided with a substrate stage which retains a substrate and a measuring stage which carries a fiducial member formed with a fiducial mark and/or various photoelectric sensors. U.S. Pat. No. 6,897,963 is incorporated herein by reference.

In the embodiment described above, the exposure apparatus is adopted, in which the space between the projection optical system PL and the substrate P is locally filled with the liquid. However, the present invention is also applicable to a liquid immersion exposure apparatus in which the exposure is performed in such a state that the entire surface of a substrate as an exposure objective is immersed in the liquid, as disclosed, for example, in Japanese Patent Application Laid-open Nos. 6-124873 and 10-303114 and U.S. Pat. No. 5,825,043.

The embodiment described above has been explained as exemplified by the case of the exposure apparatus provided with the projection optical system PL by way of example. However, the present invention is applicable to an exposure apparatus and an exposure method in which the projection optical system PL is not used. Even when the projection optical system PL is not used as described above, then the exposure light beam is radiated onto the substrate via an optical member such as a lens or a diffractive optical element, and the liquid immersion area is formed in a predetermined space between the substrate and the optical member as described above.

The present invention is also applicable, for example, to an exposure apparatus in which a substrate is exposed with a line-and-space pattern by forming interference fringes on the substrate as disclosed, for example, in International Publication No. 2001/035168, and an exposure apparatus in which two mask patterns are combined on a substrate via a projection optical system, and one shot area on the substrate is subjected to the double exposure substantially simultaneously by means of one time scanning exposure as disclosed, for example, in Japanese Patent Application Laid-open No. 2004-519850 (PCT) (corresponding to U.S. Pat. No. 6,611,316).

The disclosures of all of the Japanese laid-open patent documents and United States patent documents in relation to, for example, the exposure apparatus cited in the respective embodiments and the modified embodiments are incorporated herein by reference within a range of permission of the domestic laws and ordinances of the state designated or selected in this international application.

As for the type of the exposure apparatus, the present invention is not limited to the exposure apparatus for producing the microdevice such as the semiconductor element for exposing the substrate P with the semiconductor element pattern. The present invention is also widely applicable, for example, to the exposure apparatus for producing the liquid crystal display element or for producing the display as well as the exposure apparatus for producing the thin film magnetic head, the image pickup device (CCD), the micromachine, MEMS, and the DNA chip.

The present invention is also applicable to an exposure apparatus for transferring a circuit pattern from a mother reticle to a glass substrate or a silicon wafer in order to produce a reticle or a mask to be used, for example, for the light exposure apparatus, the EUV exposure apparatus, the X-ray exposure apparatus, and the electron beam exposure apparatus. In general, the transmissive type reticle is used for the exposure apparatus which uses DUV (deep ultraviolet) light or VUV (vacuum ultraviolet) light. Those usable as the reticle substrate include, for example, silica glass, fluorine doped silica glass, calcium fluoride, magnesium fluoride, and quartz crystal. In the case of the electron beam exposure apparatus and the X-ray exposure apparatus based on the proximity manner, the transmissive type mask (stencil mask, membrane mask) is used. For example, a silicon wafer is used as the mask substrate.

In the embodiment described above, the light-transmissive type mask is used, in which the predetermined light-shielding pattern (or the phase pattern or the light-reducing pattern) is formed on the light-transmissive base material. However, in place of this mask, it is also allowable to use an electronic mask (also referred to as "variable shaped beam mask" including, for example, DMD (Digital Micro-mirror Device) as one of non-light emission type image display element (spatial optical modulator)) for forming a transmissive pattern, a reflective pattern, or a light emission pattern on the basis of electronic data of a pattern to be formed on a substrate as an exposure objective as disclosed, for example, in U.S. Pat. No. 6,778,257.

The exposure apparatus according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

What is claimed is:

1. An exposure apparatus comprising:
   a projection system which projects a pattern image onto a substrate through a liquid, the projection system including an optical element having an end surface via which the pattern image is projected and an outer surface extending upwardly and radially outwardly from the end surface;
   a liquid immersion member which includes a liquid-flow passage for the liquid and includes a surface facing the outer surface of the optical element with a gap;
   a liquid-repellent film which covers at least part of the outer surface of the optical element; and
   a protection film which protects the liquid-repellent film from UV radiation, wherein
   the optical element includes a base material, and
   the protection film is provided between the base material and the liquid-repellent film to prevent the liquid-repellent film from being irradiated with the UV radiation through the base material.

2. The exposure apparatus according to claim 1, wherein the liquid-repellent film is a water-repellent film.

3. The exposure apparatus according to claim 1, wherein the optical element is a final optical element closest to an image plane of the projection system.

4. The exposure apparatus according to claim 1, wherein the protection film has an optical density, OD, of not less than 1.

5. The exposure apparatus according to claim 1, wherein the protection film includes one of a metal film and a metal oxide film.

6. The exposure apparatus according to claim 5, wherein the metal film is formed of at least one metal selected from the group consisting of Au, Pt, Ag, Ni, Ta, W, Pd, Mo, Ti, Si, and Cr.

7. The exposure apparatus according to claim 5, wherein the metal oxide film is formed of at least one substance selected from the group consisting of $ZrO_2$, $HfO_2$, $TiO_2$, $Ta_2O_5$, SiO, and $Cr_2O_3$.

8. The exposure apparatus according to claim 1, wherein the liquid-repellent film is composed of fluororesin.

9. A method for producing a microdevice, comprising:
   exposing a substrate with the exposure apparatus according to claim 1;
   developing the exposed substrate; and
   processing the developed substrate.

10. The exposure apparatus according to claim 1, wherein the liquid-repellent film is directly formed on the protection film.

11. The exposure apparatus according to claim 1, wherein the protection film is directly formed on the base material.

12. An optical element for an exposure apparatus, comprising:
   a base material;
   a liquid-repellent member which is located only outside an effective area of the optical element; and
   a protection member which protects the liquid-repellent member from UV radiation, wherein
   the protection member is provided between the base material and the liquid-repellent member to prevent the liquid-repellent member from being irradiated with the UV radiation through the base material.

13. The optical element according to claim 12, wherein the protection member reduces light to protect the liquid-repellent member from light irradiation, and
   the protection member is provided outside the effective area of the optical element.

14. The optical element according to claim 12, wherein the protection member reduces light to protect the liquid-repellent member from light irradiation, and
   the protection member is provided on a side surface of the optical element.

15. The optical element according to claim 12, wherein the protection member reduces light to protect the liquid-repellent member from light irradiation, and
   the protection member is provided in an area which does not intersect an optical axis of the optical element.

16. The optical element according to claim 12, wherein the optical element makes contact with a liquid.

17. The optical element according to claim 16, wherein a light-outgoing surface of the optical element makes contact with the liquid.

18. The optical element according to claim 12, wherein at least one of the protection member and the liquid-repellent member is a thin film.

19. The optical element according to claim 12, wherein the protection member is a light-shielding film.

20. The optical element according to claim 19, wherein the light-shielding film has an optical density, OD, of not less than 1.

21. The optical element according to claim 12, wherein the protection member is formed with one of a metal film and a metal oxide film.

22. The optical element according to claim 21, wherein the metal film is formed of at least one metal selected from the group consisting of Au, Pt, Ag, Ni, Ta, W, Pd, Mo, Ti, Si, and Cr.

23. The optical element according to claim 21, wherein the metal oxide film is formed of at least one selected from the group consisting of $ZrO_2$, $HfO_2$, $TiO_2$, $Ta_2O_5$, SiO, and $Cr_2O_3$.

24. The optical element according to claim 12, wherein a plurality of film layers, which include a light-reducing film as the protection member and a liquid-repellent film as the liquid-repellent member, are provided on a surface of the base material, and
   an outermost surface layer of the plurality of layers is the liquid-repellent member.

25. The optical element according to claim 12, wherein the protection member is provided on at least a part of a surface of the base material, and
   the liquid-repellent member is provided on at least a part of a surface of the protection member.

26. An optical system which is used for a liquid immersion exposure apparatus, comprising the optical element as defined in claim 12.

27. The optical system according to claim 26, wherein an optical path space, which is disposed on a light-outgoing side of the optical element, is filled with a liquid.

28. The optical system according to claim 26, wherein the optical system is a projection optical system which projects a predetermined pattern onto a substrate.

29. A liquid immersion exposure apparatus comprising an optical element as defined in claim 12.

30. The liquid immersion exposure apparatus according to claim 29, wherein the optical element makes contact with a liquid.

31. The liquid immersion exposure apparatus according to claim 30, wherein a light-outgoing surface of the optical element makes contact with the liquid.

32. The liquid immersion exposure apparatus according to claim 29, wherein the protection member reduces light to protect the liquid-repellent member from light irradiation, and
the protection member is provided outside an effective area of the optical element.

33. The liquid immersion exposure apparatus according to claim 29, wherein the protection member reduces light to protect the liquid-repellent member from light irradiation, and
the protection member is provided on a side surface of the optical element.

34. The liquid immersion exposure apparatus according to claim 29, wherein the protection member reduces light to protect the liquid-repellent member from light irradiation, and
the protection member is provided in an area which does not intersect an optical axis of the optical element.

35. The liquid immersion exposure apparatus according to claim 29, wherein the protection member is provided on at least a part of a surface of the base material, and
the liquid-repellent member is provided on at least a part of a surface of the protection member.

36. The optical element according to claim 12, wherein the liquid-repellent member is composed of fluororesin.

37. A liquid immersion exposure method, comprising:
providing a substrate; and
exposing the substrate via an optical element for an exposure apparatus, the optical element comprising:
a base material;
a liquid-repellent member which is located only outside an effective area of the optical element; and
a protection member which protects the liquid-repellent member from UV radiation, wherein
the protection member is provided between the base material and the liquid-repellent member to prevent the liquid-repellent member from being irradiated with the UV radiation through the base material.

38. The liquid immersion exposure method according to claim 37, further comprising supplying a liquid, wherein the optical element makes contact with the supplied liquid.

39. The liquid immersion exposure method according to claim 38, wherein the liquid is supplied to a light-outgoing side of the optical element.

40. The liquid immersion exposure method according to claim 39, wherein the substrate is exposed via an optical system which includes the optical element, and
the optical system includes another optical element which is different from the optical element and which is disposed on the light-outgoing side of the optical element.

41. A method for producing a microdevice, comprising:
exposing the substrate by means of the liquid immersion exposure method as defined in claim 37;
developing the exposed substrate; and
processing the developed substrate.

42. The liquid immersion exposure method according to claim 37, wherein the liquid-repellent member is composed of fluororesin.

* * * * *